US012676191B2

(12) United States Patent
Kim et al.

(10) Patent No.: US 12,676,191 B2
(45) Date of Patent: Jul. 7, 2026

(54) SEEDING BIAS CONTROL FOR SUB-BLOCK GROUPS IN A MEMORY DEVICE

(71) Applicant: Micron Technology, Inc., Boise, ID (US)

(72) Inventors: Taehyun Kim, San Jose, CA (US); Brian Kwon, San Jose, CA (US); Dong Kyo Shim, Milpitas, CA (US); Kwang Ho Kim, Pleasanton, CA (US); Erwin E. Yu, San Jose, CA (US); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 18/748,679

(22) Filed: Jun. 20, 2024

(65) Prior Publication Data

US 2024/0428862 A1      Dec. 26, 2024

Related U.S. Application Data

(60) Provisional application No. 63/521,990, filed on Jun. 20, 2023.

(51) Int. Cl.
| | |
|---|---|
| *G11C 16/10* | (2006.01) |
| *G11C 11/56* | (2006.01) |
| *G11C 16/04* | (2006.01) |
| *G11C 16/08* | (2006.01) |
| *G11C 16/32* | (2006.01) |
| *G11C 16/34* | (2006.01) |

(52) U.S. Cl.
CPC ........ *G11C 16/102* (2013.01); *G11C 11/5628* (2013.01); *G11C 16/0483* (2013.01); *G11C 16/08* (2013.01); *G11C 16/10* (2013.01); *G11C 16/32* (2013.01); *G11C 16/3404* (2013.01); *G11C 16/3427* (2013.01)

(58) Field of Classification Search
CPC ... G11C 16/102; G11C 16/08; G11C 16/3404; G11C 11/5628; G11C 16/0483; G11C 16/10; G11C 16/32; G11C 16/3427
See application file for complete search history.

(56) References Cited

U.S. PATENT DOCUMENTS

| | | | | |
|---|---|---|---|---|
| 11,222,674 | B2 * | 1/2022 | Li | G11C 16/06 |
| 2023/0197164 | A1 * | 6/2023 | Diep | G11C 16/08 |
| | | | | 365/185.2 |

* cited by examiner

*Primary Examiner* — Alexander Sofocleous
*Assistant Examiner* — Joseph Fidelis Stormes
(74) *Attorney, Agent, or Firm* — Lowenstein Sandler LLP

(57) ABSTRACT

Control logic in a memory device initiates a program operation to program one or more memory cells of a first sub-block of a memory array, the program operation including a seeding phase. During the seeding phase, a first wordline voltage is caused to be applied to a first wordline segment associated with a first portion of the memory array. During the seeding phase, a second wordline voltage is caused to be applied to a second wordline segment associated with a second portion of the memory array, where the first wordline voltage and the second wordline voltage cause a seeding bias voltage to be applied to the first sub-block group and inhibit application of the seeding bias voltage to the second sub-block group.

20 Claims, 14 Drawing Sheets

Figure 3:
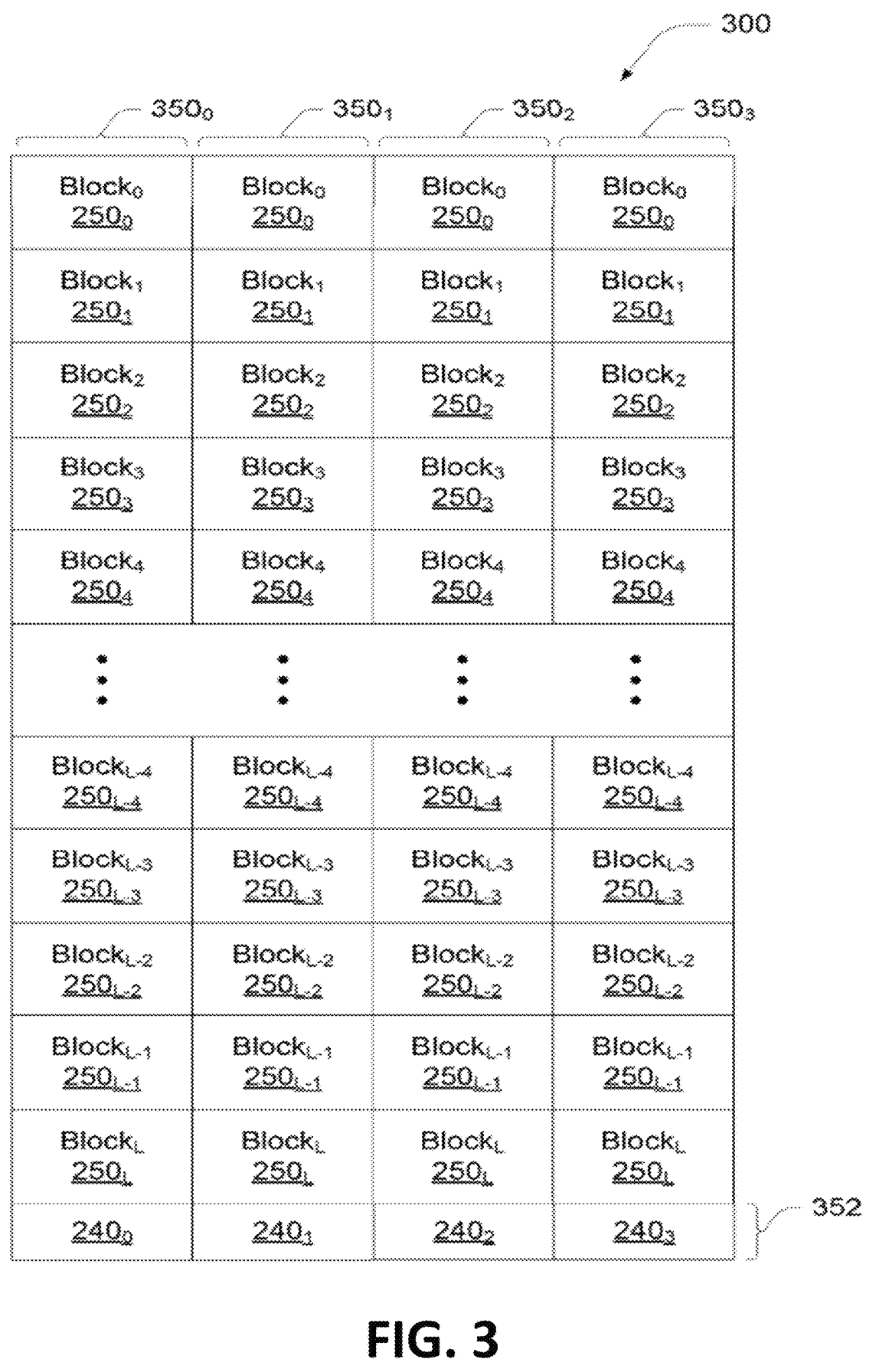

300

| $350_0$ | $350_1$ | $350_2$ | $350_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

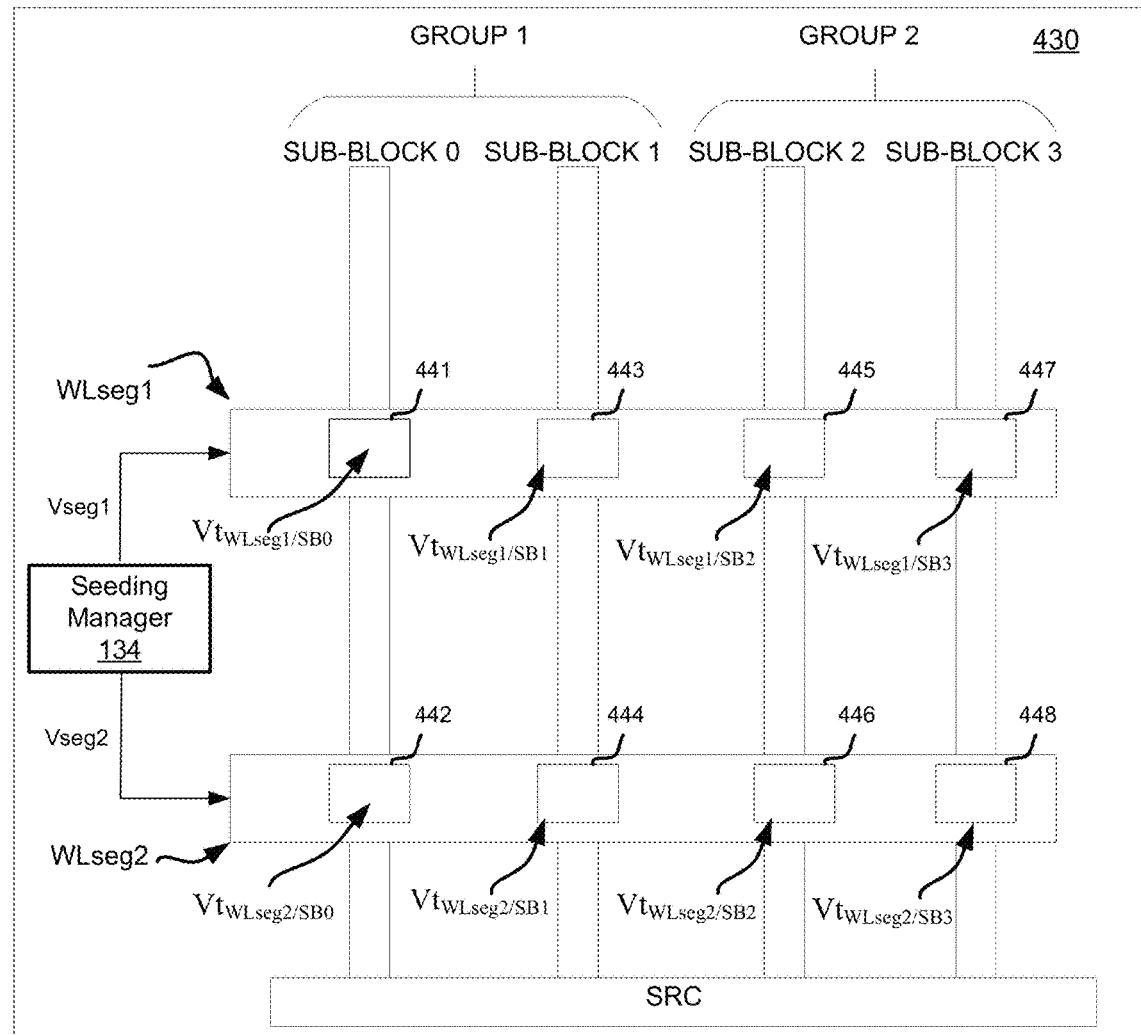

SB0 OFF (Seeding not performed): EITHER $Vseg1 < Vt_{WLseg1/SB0}$ OR $Vseg2 < Vt_{WLseg2/SB0}$ SB0 ON (Seeding performed): $Vseg1 > Vt_{WLseg1/SB0}$ AND $Vseg2 > Vt_{WLseg2/SB0}$

450

SB1 OFF (Seeding not performed): EITHER $Vseg1 < Vt_{WLseg1/SB1}$ OR $Vseg2 < Vt_{WLseg2/SB1}$ SB1 ON (Seeding performed): $Vseg1 > Vt_{WLseg1/SB1}$ AND $Vseg2 > Vt_{WLseg2/SB1}$ SB2 OFF (Seeding not performed): EITHER $Vseg1 < Vt_{WLseg1/SB2}$ OR $Vseg2 < Vt_{WLseg2/SB2}$ SB2 ON (Seeding performed): $Vseg1 > Vt_{WLseg1/SB2}$ AND $Vseg2 > Vt_{WLseg2/SB2}$ SB3 OFF (Seeding not performed): EITHER $Vseg1 < Vt_{WLseg1/SB3}$ OR $Vseg2 < Vt_{WLseg2/SB3}$ SB3 ON (Seeding performed): $Vseg1 > Vt_{WLseg1/SB3}$ AND $Vseg2 > Vt_{WLseg2/SB3}$

FIG. 8

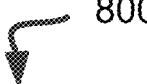
800

Initiate a program operation to program one or more memory cells of a first sub-block of a memory array of a memory device, the program operation including a seeding phase, where the memory device includes a first sub-block group including the first sub-block and a second sub-block and a second sub-block group including a third sub-block and a fourth sub-block
810

Cause, during the seeding phase, a first wordline voltage to be applied to a first wordline segment associated with the memory array
820

Cause, during the seeding phase, a second wordline voltage to be applied to a second wordline segment associated with the memory array, where the first wordline voltage and the second wordline voltage cause no seeding bias voltage to be applied to the first sub-block group and cause a seeding bias voltage to be applied to the second sub-block group
830

SEEDING BIAS CONTROL FOR SUB-BLOCK GROUPS IN A MEMORY DEVICE

CROSS-REFERENCE TO RELATED APPLICATION

This application claims the benefit of U.S. Provisional Application No. 63/521,990, titled "Seeding Bias Control for Sub-block Groups in a Memory Device," filed Jun. 20, 2023, which is hereby incorporated herein by reference in its entirety.

TECHNICAL FIELD

Embodiments of the disclosure relate generally to memory sub-systems, and more specifically, relate to seeding bias control for multiple sub-blocks of a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a block schematic of a portion of an array of memory cells as could be used in a memory of the type described with reference to FIG. 1B, in accordance with one or more embodiments of the present disclosure.

FIG. 4A illustrates an example memory device including control logic to control the execution of a seeding operation for groups of sub-blocks of the memory device using wordline bias voltages applied to respective wordline segments during a programming operation of one or more memory cells of a target sub-block, in accordance with one or more embodiments of the present disclosure.

FIG. 8 is a flow diagram of an example method to execute a seeding scheme including selectively controlling the application of seeding bias levels applied to groups of memory sub-blocks of a memory device, in accordance with one or more embodiments of the present disclosure.

DETAILED DESCRIPTION

Figure 1A:
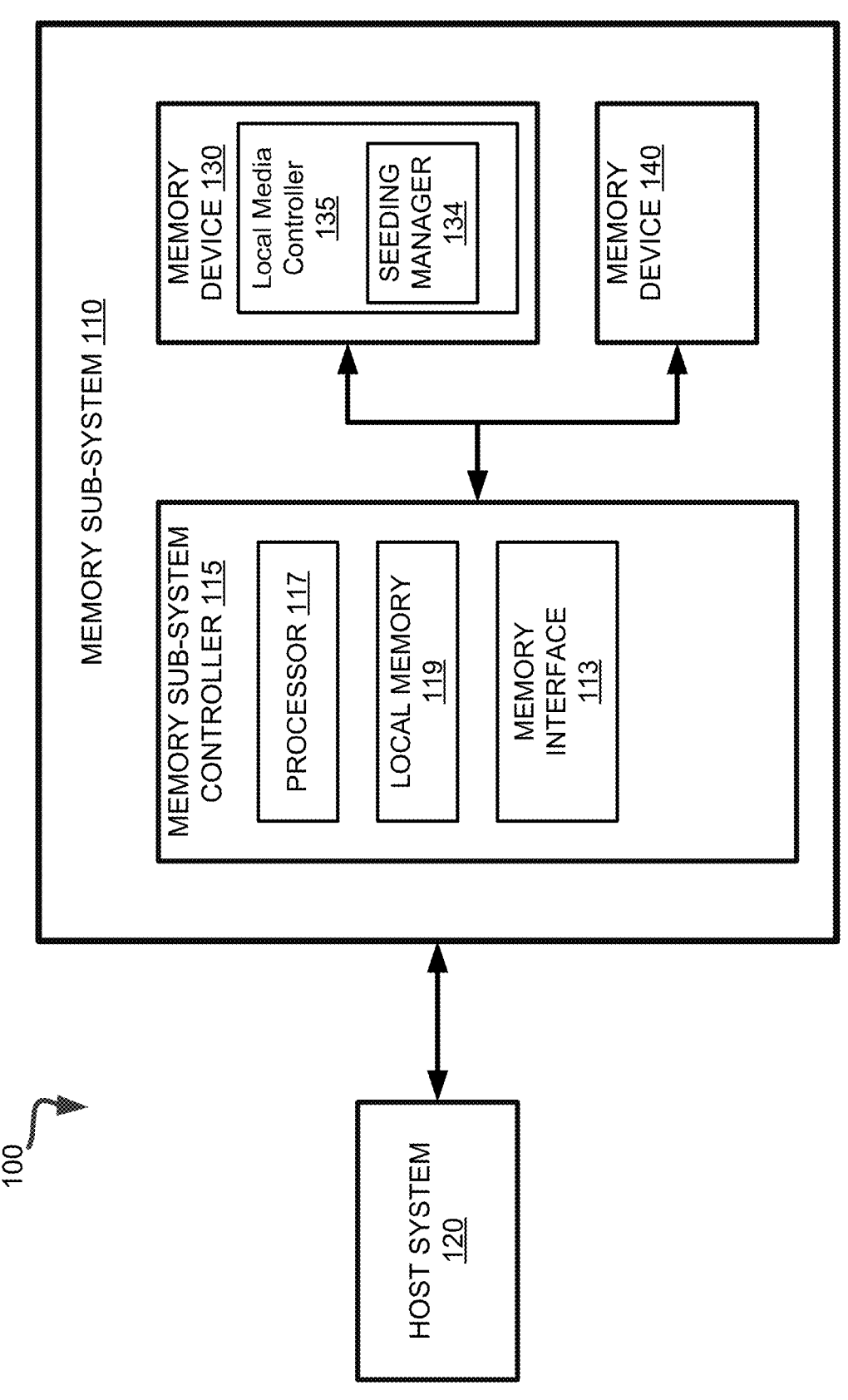
FIG. 1A illustrates an example computing system that includes a memory sub-system, in accordance with one or more embodiments of the present disclosure.

Aspects of the present disclosure are directed to seeding bias control for segmented select gate sources associated with multiple sub-blocks of a memory device in a memory sub-system. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not- and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A data block hereinafter refers to a unit of the memory device used to store data and can include a group of memory cells, a wordline group, a wordline, or individual memory cells. Each data block can include a number of sub-blocks, where each sub-block is defined by a set of associated pillars (e.g., one or more vertical conductive traces) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

During a programming operation, a selected memory cell(s) can be programmed with the application of a programming voltage to a selected wordline. Due to the wordline being common to multiple memory cells, unselected memory cells can be subject to the same programming voltage as the selected memory cell(s). If not otherwise preconditioned, the unselected memory cells can experience effects from the programming voltage on the common wordline. These programming voltage effects can include the condition of charge being stored in the unselected memory cells which are expected to maintain stored data. This programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$).

Performing a programming operation may involve floating the pillars of both selected sub-block and unselected sub-blocks by turning off both the select gate drain (SGD) and select gate source (SGS) signals that control the respective drain side and source side select transistors coupled to each string of memory cells. Once the pillars are floated, the unselected wordlines can be discharged to a predefined potential, thus boosting down the potential at the pillar of the selected sub-block to a corresponding negative potential. As a result, the programming voltage pulses, which can be sequentially applied to the target (selected) wordline, can be reduced by the value of the negative potential of the pillar while maintaining the same level of programming stress and the program inhibit stress as the level which would be achieved without applying the negative potential to the pillar.

The presence of residue electrons, such as electrons trapped or otherwise remaining inside the poly-silicon channel of a charge storage structure after an earlier operation (e.g., a previous program operation), can contribute to the program disturb effect. At the end of a program verify operation, for example, a pass voltage (Vpass) applied to the wordlines that are not being programmed ramps down and wordlines on the source side having a high threshold voltage will cut off prior to wordlines with a lower threshold voltage. Therefore, electrons will be trapped inside the poly-silicon channel at the wordlines with the lower threshold voltage (i.e., between the cut off wordlines) and become residue electrons. Since the poly-silicon channel (i.e., the pillar channel region) in some non-volatile memory devices is a floating channel that may not be connected to a bulk grounded body, there is generally no path for residual electrons in the channel region to discharge other than through towards the source of the memory string.

Some programming operations generally include a seeding phase where a seeding voltage (e.g., approximately 2 volts) is applied on the string and a ground voltage (e.g., approximately 0 volts) is applied to all of the wordlines intersecting the string, including the selected wordline. Using a ground voltage during the seeding phase causes the source side wordlines to remain off and the residue electrons remain trapped on the source side of the selected wordline at the end of the seeding phase. These residue electrons can contribute to program disturb in a number of ways. For example, when the pass voltage or a program voltage is ramped up in a subsequent program operation, the selected wordline can suffer from hot-electron ("hot-e") disturb where a large voltage differential between the gate and source causes the residue electrons to be injected from a drain depletion region into the floating gate. In addition, this voltage differential can initiate an electrostatic field of sufficient magnitude to change the charge on the selected wordline and cause the contents of the memory cell to be programmed inadvertently or read incorrectly. Furthermore, the electrostatic field can cause local electron-hole pair generation in the channel region, leading to even more electrons that can be injected into the selected wordline.

In some systems, the seeding operation can be controlled to reduce power consumption during selected programming loops (i.e., programming pulses). For example, such systems can skip or vary the seeding operation with respect to non-selected sub-groups associated with an SGS for a selected number of loops or programming pulses, based on a total number of loops of the programming operation. In this approach, the SGS associated with the memory block can be turned off during certain programming pulses (e.g., programming pulse 1 and programming pulse 2) to skip the seeding operation during those pulses. In this example, the seeding of the memory block can be performed by turning the SGS on prior to bitline setup during subsequent programming pulses (e.g., programming pulse 3, programming pulse 4, etc.). However, the skipping of seeding associated with a memory block based on the programming loop number fails to achieve desired performance benefits and reduction of the occurrence of peak power consumption.

Aspects of the present disclosure address the above and other deficiencies by implementing a seeding scheme including controlling the seeding bias level (i.e., a seeding voltage) applied to a segmented wordline (i.e., a first wordline segment associated with a first portion of a memory array and a second wordline segment associated with a second portion of the memory array) associated with multiple groups of memory sub-blocks of a memory device. In an embodiment, a target wordline is segmented to include a first wordline segment (WLseg1 associated with a first portion of a memory array) and a second wordline segment (WLseg2 associated with a second portion of the memory array). In an embodiment, the seeding operation with respect to different sub-block groups can be controlled using the wordline bias voltages applied to the respective wordline segments.

In an embodiment, the sub-blocks of the memory device can be grouped into a first group or subset of memory sub-blocks (e.g., sub-block 0 and sub-block 1) and a second group or subset of memory sub-blocks (e.g., sub-block 2 and sub-block 3). In an embodiment, the seeding operation of the first group of sub-blocks (group 1) can be controlled by applying a first wordline bias voltage (Vseg1) to the first wordline segment (WLseg1) and a second wordline bias voltage (Vseg2) to the second wordline segment (WLseg2) that satisfies one of a first seeding operation condition or a second seeding operation condition.

In an embodiment, if either the first wordline bias voltage or the second wordline bias voltage satisfies a first seeding operation condition, the corresponding memory cell is turned "off", which prevents current from flowing through the sub-block which causes the skipping of the seeding operation with respect to that sub-block (i.e., the seeding voltage is not applied to the sub-block). In an embodiment, the first seeding operation condition is satisfied if either the first wordline bias voltage (Vseg1) applied to the first wordline segment (WLseg1) is less than a threshold voltage level associated with a first memory cell (Vtcell$_{WLseg1/SB0}$) of the first wordline segment (WLseg1) or the second wordline bias voltage (Vseg2) applied to the second wordline segment (WLseg2) is less than a threshold voltage level associated with a second memory cell (Vtcell$_{WLseg2/SB0}$) of the second wordline segment (WLseg2).

In an embodiment, a first sub-block including a first memory cell (cell$_{WLseg1}$) of a first wordline segment (WLseg1) and a second memory cell (cellWLseg2) of a second wordline segment (WLseg1) is turned "off" and the seeding of the first sub-block is skipped or not performed (i.e., no seeding bias voltage is applied) if the following first seeding operation condition is satisfied:

$$\text{EITHER } Vseg1 < Vt_{cellWLseg1/SB0} \text{ OR } Vseg2 < Vt_{cellWLseg2/SB0}.$$

In an embodiment, if both the first wordline bias voltage and the second wordline bias voltage satisfy the second seeding operation condition (e.g., the first wordline bias voltage applied to the first wordline segment and the second wordline bias voltage applied to the second wordline segment turn the corresponding memory cells of a sub-block or channel "on"), current flows through the corresponding sub-block, which enables the application of a seeding bias level (i.e., a seeding voltage) to the sub-block. In an embodiment, the second condition is satisfied if both the first wordline bias voltage (Vseg1) applied to a first memory cell of the first wordline segment (WLseg1) is greater than a threshold voltage level associated with the first memory cell and the second wordline bias voltage (Vseg2) applied to a second memory cell of the second wordline segment (WLseg2) is greater than a threshold voltage level associated with the second memory cell of the second wordline segment (WLseg2).

In an embodiment, a first sub-block (e.g., sub-block 0) including a first memory cell (cell$_{WLseg1}$) of a first wordline segment (WLseg1) and a second memory cell (cell$_{WLseg2}$) of a second wordline segment (WLseg2) is turned "on" to enable seeding of the first sub-block if the following second seeding operation condition is satisfied:

$$Vseg1 > Vt_{WLseg1/SB0} \text{ AND } Vseg2 > Vtcell_{WLseg2/SB0};$$

where Vseg1 represents a first wordline bias voltage applied to the first wordline segment (WLseg1), Vseg2 represents a second wordline bias voltage applied to the second wordline segment (WLseg2), Vtcell$_{WLseg1/SB0}$ represents a threshold voltage associated with a first memory cell corresponding to the first wordline segment (WLseg1) and the first sub-block, and Vtcell$_{WLseg2/SB0}$ represents a threshold voltage associated with a second memory cell corresponding to the second wordline segment (WLseg2) and the first sub-block.

Accordingly, the seeding operation with respect to a first group of sub-blocks (e.g., sub-block 0 and sub-block 1) and a second group of sub-blocks (e.g., sub-block 2 and sub-block 3) can be controlled by applying a first wordline bias voltage (Vseg1) to a first wordline segment (WLseg1) and a second wordline bias voltage (Vseg2) to a second wordline segment (WLseg2) and determining whether a first seeding operation condition is satisfied (i.e., a condition indicating that a sub-block is turned off and the seeding operation is skipped or not performed) or a second seeding operation condition is satisfied (i.e., a condition indicating a sub-block is turned on to enable current flow and cause the seeding operation to be performed).

Advantageously, control logic of the memory device manages the wordline bias voltage levels applied to different electrically-segmented wordlines (e.g., WLseg1 and WLseg2) corresponding to the multiple sub-block groups (e.g., the first group of sub-blocks and the second group of sub-blocks) to selectively enable the seeding operation or skip the seeding operation for different groups of sub-blocks during one or more programming loops associated with programming one or more target memory cells of the memory device. According to embodiments, controlling the execution of the seeding operation for specific groups of sub-blocks using wordline bias voltages applied to segmented wordlines enables improved control of the enabling or disabling (e.g., skipping) seeding operations during execution of a programming operation leads to greater memory device endurance and improved power consumption management.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not- and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not- or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controllers 135 can implement a seeding manager 134 that can manage the driving or loading of data to SGDs associated with multiple sub-blocks during execution of a ganged programming operation (e.g., the concurrent programming of two more sub-blocks of a memory array). In an embodiment, the seeding manager 134 executes one or more re-drive operations (e.g., a driving pulse that is applied to re-drive previously driven and disturbed data).

The seeding manager 134 identifies a request for the execution of a ganged programming to program multiple sub-blocks (e.g., two or more sub-blocks) of the memory array of one or more memory devices. In an embodiment, as part of the execution of the ganged programming operation, the seeding manager 134 executes a first drive operation to load data to be programmed to a first SGD associated the first sub-block. The seeding manager 134 executes a second drive operation to load data to be programmed to a second SGD associated with the second sub-block. According to embodiments, to mitigate the disturb of the first data due to the second drive operation, the seeding manager 134 executes a third drive operation (i.e., a re-drive operation) including application of a drive pulse to the first SGD to re-drive or re-load the previously loaded data. In some embodiments, the seeding manager 134 can perform multiple re-drive operations to re-drive previously driven data to multiple SGDs during a ganged programming operation associated with multiple sub-blocks.

According to an embodiment, the seeding manager 134 can execute the one or more re-drive operations outside or before the application of the programming pulse to the wordline associated with the multiple target sub-blocks. According to an embodiment, the seeding manager 134 can execute the re-drive operation inside or concurrently with the application of the programming pulse to the wordline associated with the multiple target sub-blocks. In an e embodiment, the seeding manager 134 can execute the re-drive operation including application of an extended drive pulse (i.e., a drive pulse having a larger pulse width) to the SGD being re-driven during the application of the programming pulse to the wordline.

Figure 1B:
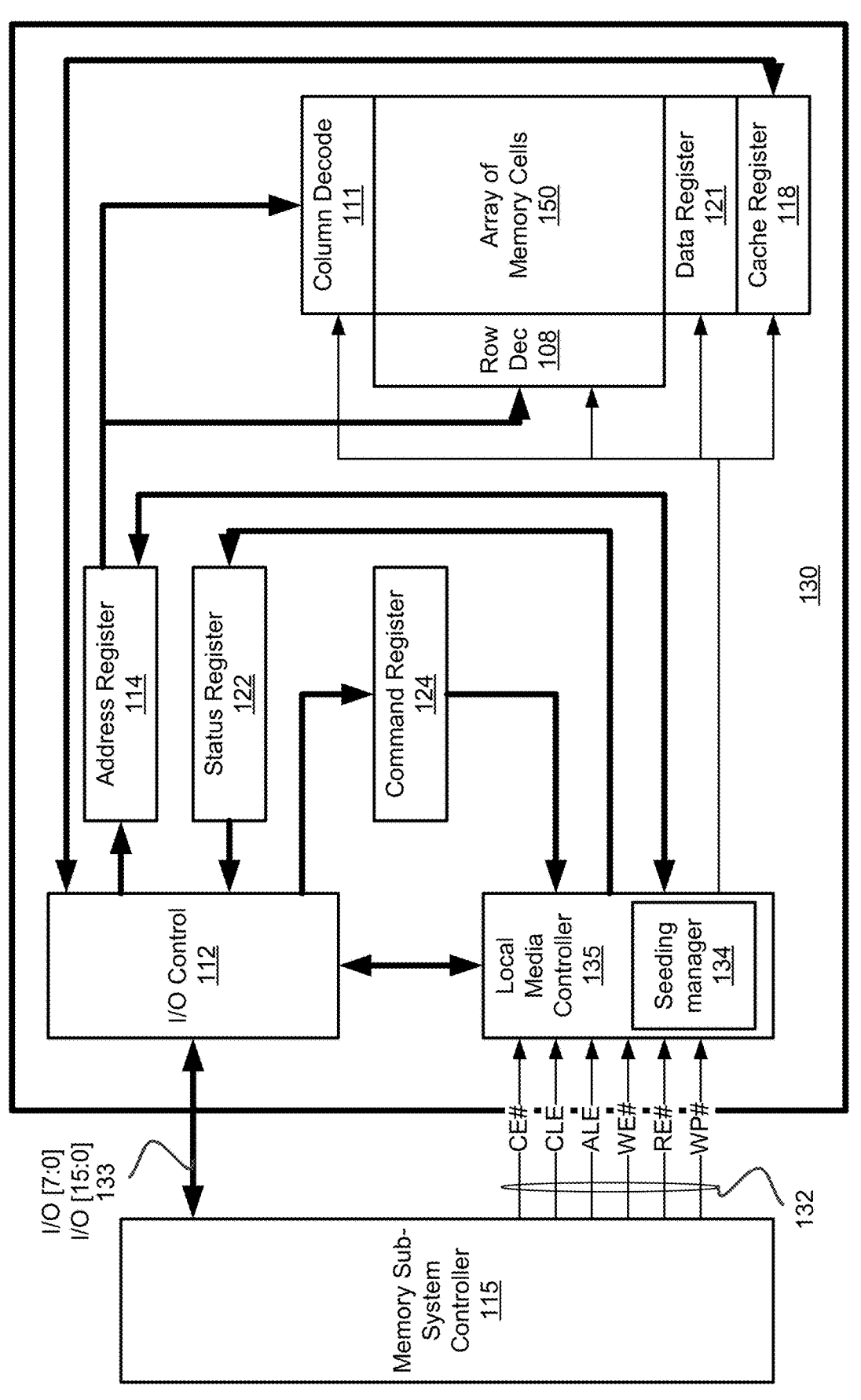
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 111 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address page buffer 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the seeding manager 134, which can implement the execution of at least a portion of the prologue sub-operations of a programming operation during a data loading stage to reduce a total programming time associated with the programming operation of a set of target memory cells of the memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 121 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 (e.g., status page buffer) may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124 (e.g., command page buffer). The addresses may be received over input/output (I/O) pins [7:0] of I/O bus 136 at I/O control circuitry 160 and may then be written into address register 114 (e.g., address page buffer). The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 121 for programming the array of memory cells 104.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
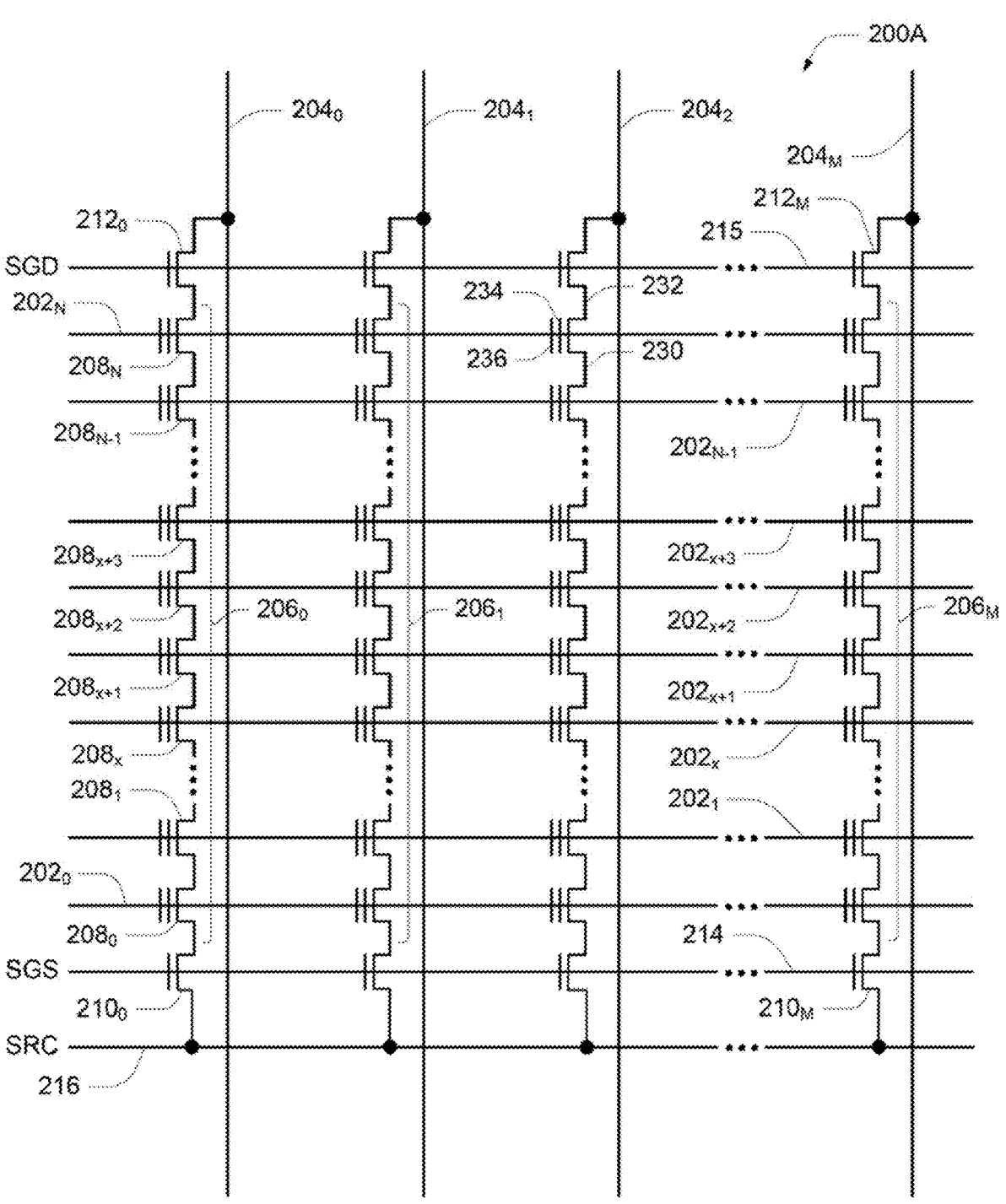
FIG. 2A-2D are schematics of portions of an array of memory cells as could be used in a memory of the type described with reference to FIG. 1B, in accordance with one or more embodiments of the present disclosure.
Figure 2B:
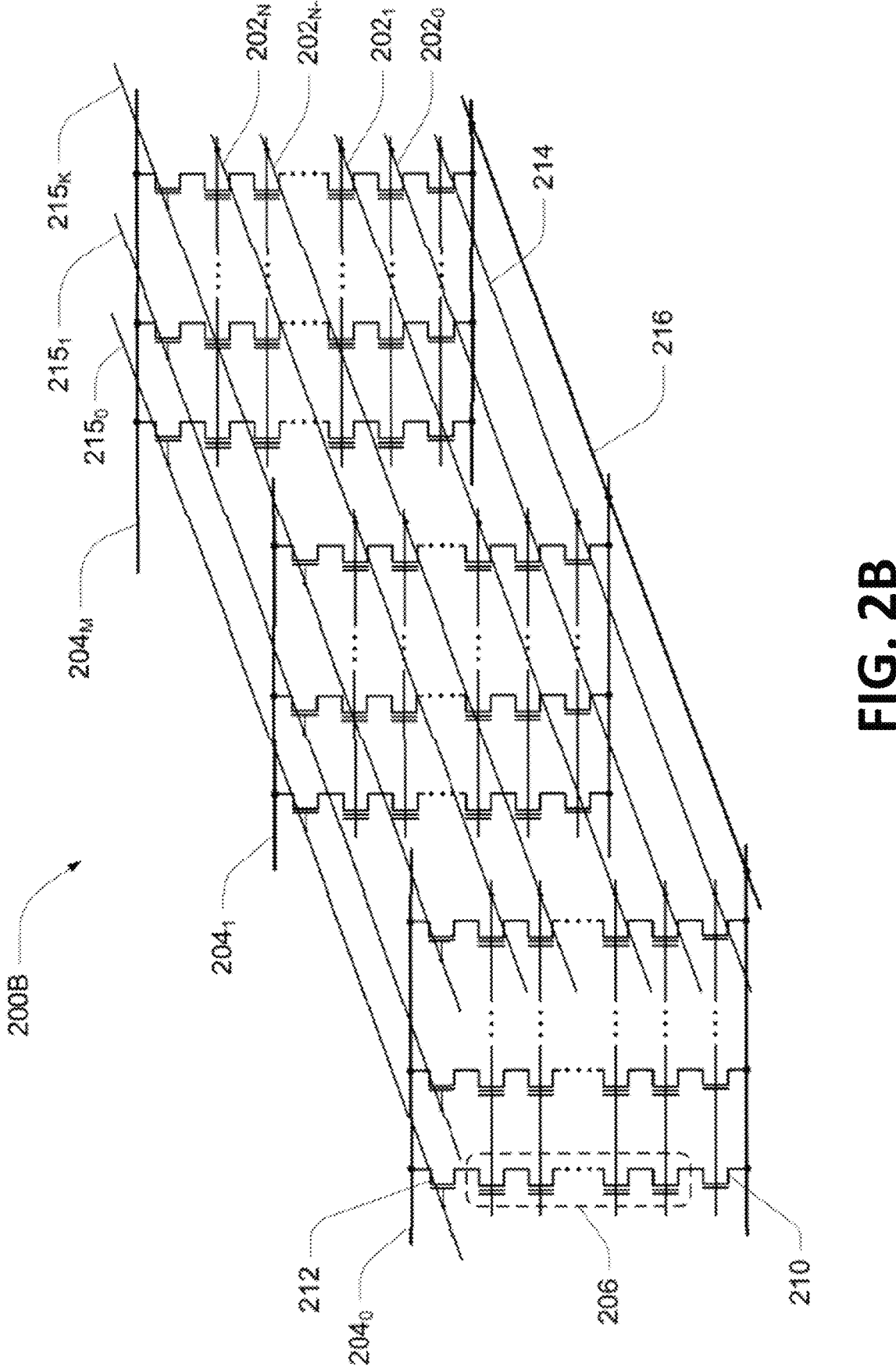
Figure 2C:
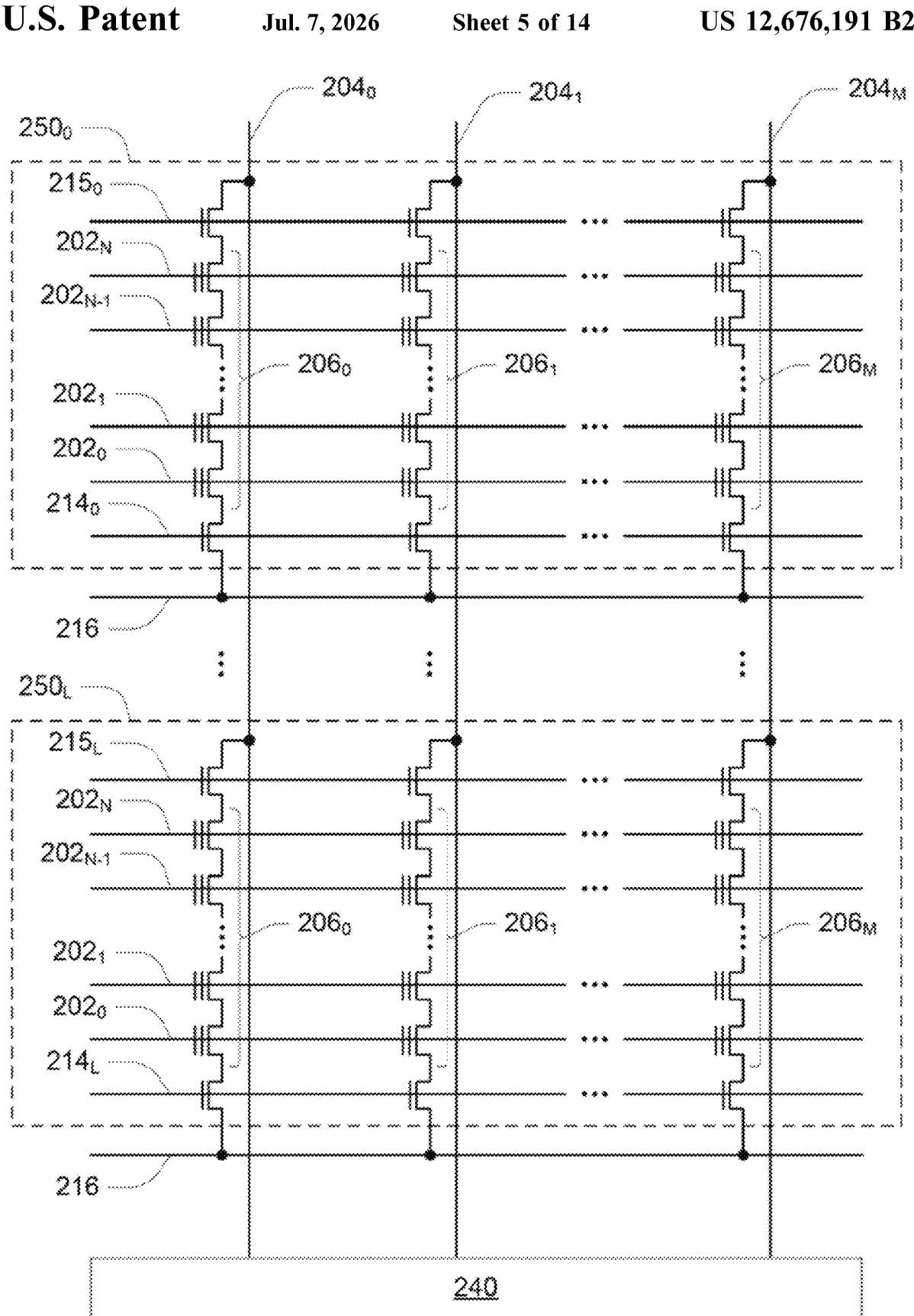

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells 2080 to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell 2080 of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line 215o. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 2D:
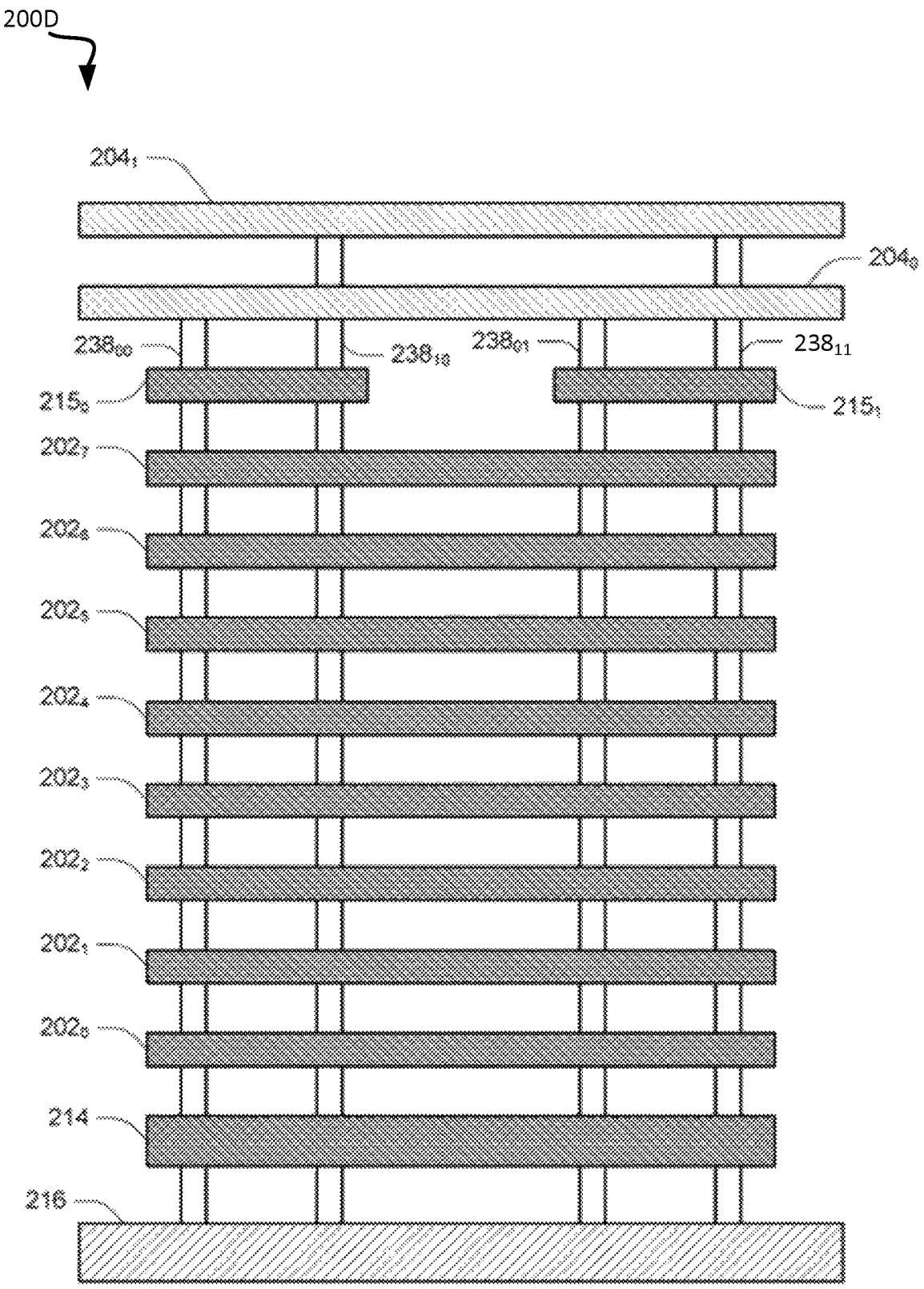

FIG. 2D is a diagram of a portion of an array of memory cells 200D (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2C) selectively connected to the bitline $204_0$. Similarly, channel regions $238_{10}$ and $238_{11}$ represent the channel regions of different strings of series-connected memory cells (e.g., NAND strings 206 of FIGS. 2A-2C) selectively connected to the bitline $204_1$. A memory cell (not depicted in FIG. 2D) may be formed at each intersection of an wordline 202 and a channel region 238, and the memory cells corresponding to a single channel region 238 may collectively form a string of series-connected memory cells (e.g., a string 206 of FIGS. 2A-2C). Additional features might be common in such structures, such as dummy wordlines, segmented channel regions with interposed conductive regions, etc.

FIG. 3 is a block schematic of an example portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

FIG. 4A illustrates an example memory device 430 including a seeding manager 134 (e.g., control logic) to control the execution of a seeding operation for groups of sub-blocks of the memory device using wordline bias voltages (Vseg1 and Vseg2) applied to respective wordline segments (e.g., WLseg1 and WLseg2) during a programming operation of one or more memory cells of a target sub-block. As illustrated in the example of FIG. 4A, the memory device 430 includes multiple groups of sub-blocks (e.g., group 1 including sub-block 0 and sub-block 1 and group 2 including sub-block 2 and sub-block 3). According to embodiments, during execution of a program operation, the seeding manager 134 causes a first wordline bias voltage (Vseg1) to be applied to the first wordline segment (WLseg1) to control whether seeding is performed with respect to the first group of sub-blocks (e.g., sub-block 0 and sub-block 1). According to embodiments, during execution of the program operation, the seeding manager 134 causes a second wordline bias voltage (Vseg2) to be applied to the second wordline segment (WLseg2) to control whether seeding is performed with respect to the second group of sub-blocks (e.g., sub-block 2 and sub-block 3).

As illustrated in the example shown in FIG. 4A, sub-block 0 of group 1 includes a first memory cell 441 corresponding to a first wordline segment (WLseg1) and a second memory cell 442 corresponding to a second wordline segment (WLseg2). In this example, the first memory cell is associated with a first threshold voltage level ($Vt_{WLseg1/SB0}$) and the second memory cell is associated with a second threshold voltage level ($Vt_{WLseg2/SB0}$). As illustrated in the example shown in FIG. 4A, sub-block 1 of group 1 includes a first memory cell 443 corresponding to the first wordline segment (WLseg1) and a second memory cell 444 corresponding to the second wordline segment (WLseg2). In this example, the first memory cell is associated with a first threshold voltage level ($Vt_{WLseg1/SB1}$) and the second memory cell is associated with a second threshold voltage level ($Vt_{WLseg2/SB0}$).

As illustrated in the example shown in FIG. 4A, sub-block 2 of group 2 includes a first memory cell 445 corresponding to the first wordline segment (WLseg1) and a second memory cell 446 corresponding to the second wordline segment (WLseg2). In this example, the first memory cell is associated with a first threshold voltage level ($Vt_{WLseg1/SB2}$) and the second memory cell is associated with a second threshold voltage level ($Vt_{WLseg2/SB2}$). As illustrated in the example shown in FIG. 4A, sub-block 3 of group 2 includes a first memory cell 445 corresponding to the first wordline segment (WLseg1) and a second memory cell 446 corresponding to the second wordline segment (WLseg2). In this example, the first memory cell is associated with a first threshold voltage level ($Vt_{WLseg1/SB3}$) and the second memory cell is associated with a second threshold voltage level ($Vt_{WLseg2/SB3}$).

In an embodiment, the seeding manager 134 causes a first wordline bias voltage (Vseg1) to be applied to the first wordline segment (WLseg1) during a program operation associated with one or more target memory cells of a target sub-block to control whether a seeding operation is performed (i.e., whether a seeding bias voltage is applied to the sub-channel) with respect to the respective sub-blocks.

In an embodiment, if either the first wordline bias voltage satisfies a first seeding operation condition, the corresponding one or more memory cells are turned "off", which prevents current from flowing through the sub-block which causes the skipping of the seeding operation with respect to that sub-block. In an embodiment, the first condition is satisfied if either the first wordline bias voltage (Vseg1) applied to the first wordline segment (WLseg1) is less than a threshold voltage level associated with a first memory cell ($Vtcell_{WLseg1}$) of the first wordline segment (WLseg1) or the second wordline bias voltage (Vseg2) applied to the second wordline segment (WLseg2) is less than a threshold voltage level associated with a second memory cell ($Vtcell_{WLseg2}$) of the second wordline segment (WLseg2).

In an embodiment, a first sub-block including a first memory cell ($cell_{WLseg1}$) of a first wordline segment (WLseg1) and a second memory cell (cellWLseg2) of a second wordline segment (WLseg1) is turned "off" and the seeding of the first sub-block is skipped or not performed if the following first seeding operation condition is satisfied:

$$\text{EITHER } Vseg1 < Vt_{cellWLseg1} \text{ OR } Vseg2 < Vt_{cellWLseg2}.$$

In an embodiment, the seeding manager 134 can turn sub-block 0 "on" to enable execution of the seeding operation with respect to sub-block 0 by applying a first wordline bias voltage (Vseg1) to the first wordline segment (WLseg1) and applying a second wordline bias voltage (Vseg2) to the second wordline segment (WLseg2) that satisfy a second condition. In an embodiment, the second condition is satisfied if both the first wordline bias voltage (Vseg1) applied to a first memory cell of the first wordline segment (WLseg1) is greater than a threshold voltage level associated with the first memory cell and the second wordline bias voltage (Vseg2) applied to a second memory cell of the second wordline segment (WLseg2) is greater than a threshold voltage level associated with the second memory cell of the second wordline segment (WLseg2).

In an embodiment, a first sub-block (e.g., sub-block 0) including the first memory cell 441 of the first wordline segment (WLseg1) and the second memory cell 442 of the second wordline segment (WLseg2) is turned "on" to enable seeding of the first sub-block if the following second seeding operation condition is satisfied:

$$Vseg1 > Vt_{WLseg1/SB0} \text{ AND } Vseg2 > Vtcell_{WLseg2/SB0};$$

where Vseg1 represents a first wordline bias voltage applied to the first wordline segment (WLseg1), Vseg2 represents a second wordline bias voltage applied to the second wordline segment (WLseg2), $Vtcell_{WLseg1/SB0}$ represents a threshold voltage associated with a first memory cell 441 corresponding to the first wordline segment (WLseg1) and sub-block 0, and $Vtcell_{WLseg2/SB0}$ represents a threshold voltage associated with a second memory cell 442 corresponding to the second wordline segment (WLseg2) and sub-block 0.

As illustrated in the example table 450, the above-described first condition and second condition relating to controlling the seeding of the respective sub-block groups (e.g., Group 1 and Group 2) are illustrated. As illustrated in table 450, sub-block 0 (SB0) can be turned off to disable or block seeding of memory cells 441 and 442 by satisfying the first condition (e.g., either $Vseg1 < Vtw_{Lseg1/SB0}$ or $Vseg2 < Vtw_{WLseg2/SB0}$). As shown, sub-block 0 (SB0) can be turned on to enable the performance of seeding of memory cells 441 and 442 by satisfying the second condition (e.g., $Vseg1 > Vtw_{WLseg1/SB0} \text{ AND } Vseg2 > Vtw_{WLseg2/SB0}$).

As illustrated in table 450, sub-block 1 (SB1) can be turned off to disable or block seeding of memory cells 443 and 444 by satisfying the first condition (e.g., either $Vseg1 < Vtw_{WLseg1/SB2}$ or $Vseg2 < Vt_{WLseg2/SB1}$). As shown, sub-block 1 (SB1) can be turned on to enable the performance of seeding of memory cells 443 and 444 by satisfying the second condition (e.g., $Vseg1 > Vtw_{WLseg1/SB2}$ AND $Vseg2 > Vt_{WLseg2/SB1}$).

According to embodiments, the seeding manager 134 can control the seeding operation (e.g., enable or disable the seeding operation and application of a seeding bias voltage) for the first group of sub-blocks (SB0 and SB1) as a pair (e.g., either both SB0 and SB1 are turned on or both SB0 and SB1 are turned off).

As illustrated in table 450, sub-block 2 (SB2) can be turned off to disable or block seeding of memory cells 445 and 446 by satisfying the first condition (e.g., either $Vseg1 < Vt_{WLseg1/SB2}$ or $Vseg2 < Vt_{WLseg2/SB2}$). In the example shown in FIG. 4A, sub-block 2 (SB2) can be turned on to enable the performance of seeding of memory cells 445 and 446 by satisfying the second condition (e.g., $Vseg1 > Vt_{WLseg1/SB2}$ AND $Vseg2 > Vt_{WLseg2/SB2}$).

As illustrated in table 450, sub-block 3 (SB3) can be turned off to disable or block seeding of memory cells 447 and 448 by satisfying the first condition (e.g., either $Vseg1 < Vt_{WLseg1/SB3}$ or $Vseg2 < Vt_{WLseg2/SB3}$). In the example shown in FIG. 4A, sub-block 3 (SB3) can be turned on to enable the performance of seeding of memory cells 447 and 448 by satisfying the second condition (e.g., $Vseg1 > Vt_{WLseg1/SB3}$ AND $Vseg2 > Vt_{WLseg2/SB3}$).

According to embodiments, the seeding manager 134 can control the seeding operation (e.g., enable or disable the seeding operation) for the first group of sub-blocks (SB2 and SB3) as a pair (e.g., either both SB2 and SB3 are turned on or both SB2 and SB3 are turned off).

Figure 4B:
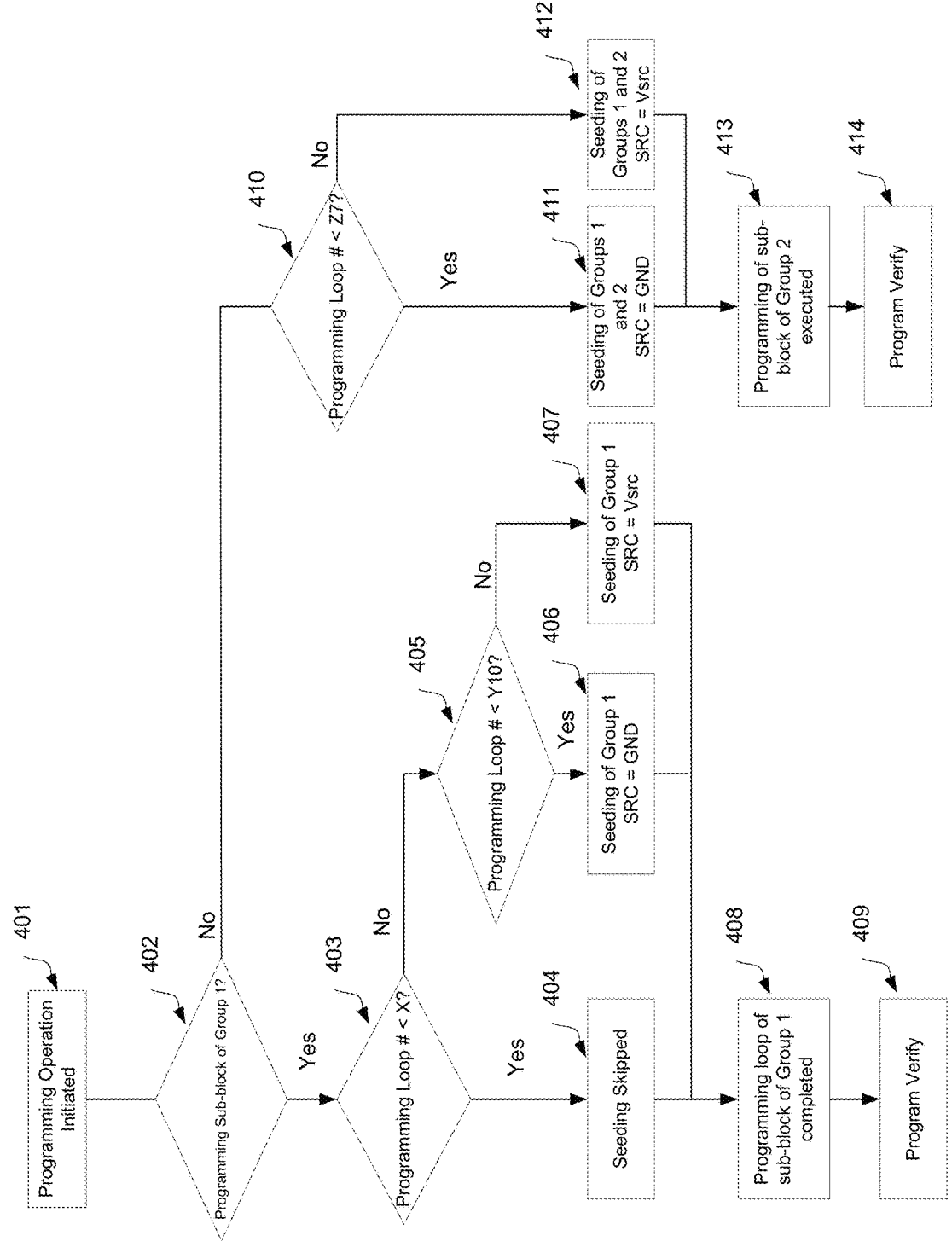
FIG. 4B illustrates a flow diagram of an example process to execute a programming operation using a seeding scheme including selectively controlling the application of seeding bias levels applied to groups of memory sub-blocks of a memory device, in accordance with one or more embodiments of the present disclosure.

FIG. 4B illustrates a process flow executable by process logic (i.e., the seeding manager 134 of FIGS. 1A, 1B, and 4A) to perform a programming operation with respect to a sub-block of multiple groups of sub-blocks (e.g., Group 1 and Group 2 of FIG. 4A) including selective seeding based on seeding criteria. According to embodiments, the seeding criteria can include a number of the programming loop or iteration of the programming operation (i.e., programming loop number), the programming voltage (Vpgm) step information, the Vpgm level (e.g., first seeding criteria is satisfied if Vpgm is greater than 12V, the second seeding criteria is satisfied if Vpgm is greater than 16V, and so on), etc.

The example shown in FIG. 4B and described herein includes the use of seeding criteria including the number of the programming loop. As illustrated, at block 401, a programming operation is initiated to program a selected sub-block (e.g., SB0, SB1, SB2, or SB3 of FIG. 4A). At block 402, a determination is made whether the sub-block to be programmed is part of Group 1 (e.g., SB0 and SB1) or Group 2 (e.g., SB2 and SB3). If the target sub-block is part of Group 1, the process continues to block 403 to determine whether first seeding criteria is satisfied. In this example, in block 403, the processing logic determines whether the programming loop number is greater than a first value X (e.g., X equals 3). If the programming loop number is less than X (e.g., 3), the processing logic determines that seeding is to be skipped (i.e., not performed) with respect to Groups 1 and 2, at block 404, and proceeds with execution of the programming loop, at block 408. Following execution of the current programming loop, a program verify operation is performed to determine if the target memory cells of the target sub-block have been programmed to the target levels, at block 409.

In an embodiment, as shown in FIG. 4B, if it is determined that the programming loop is greater than X (e.g., greater than 3), the process continues to block 405 to determine if second seeding criteria is satisfied. At block

405, the processing logic determines whether the programming loop is greater than Y (e.g., Y equal programming loop number 10). If the processing logic determines that the current programming loop number is less than Y (i.e., the second seeding criteria), the processing logic performs seeding of group 1 (and the skipping of seeding of group 2) in accordance with the embodiment shown in FIG. 5.

Figure 5:
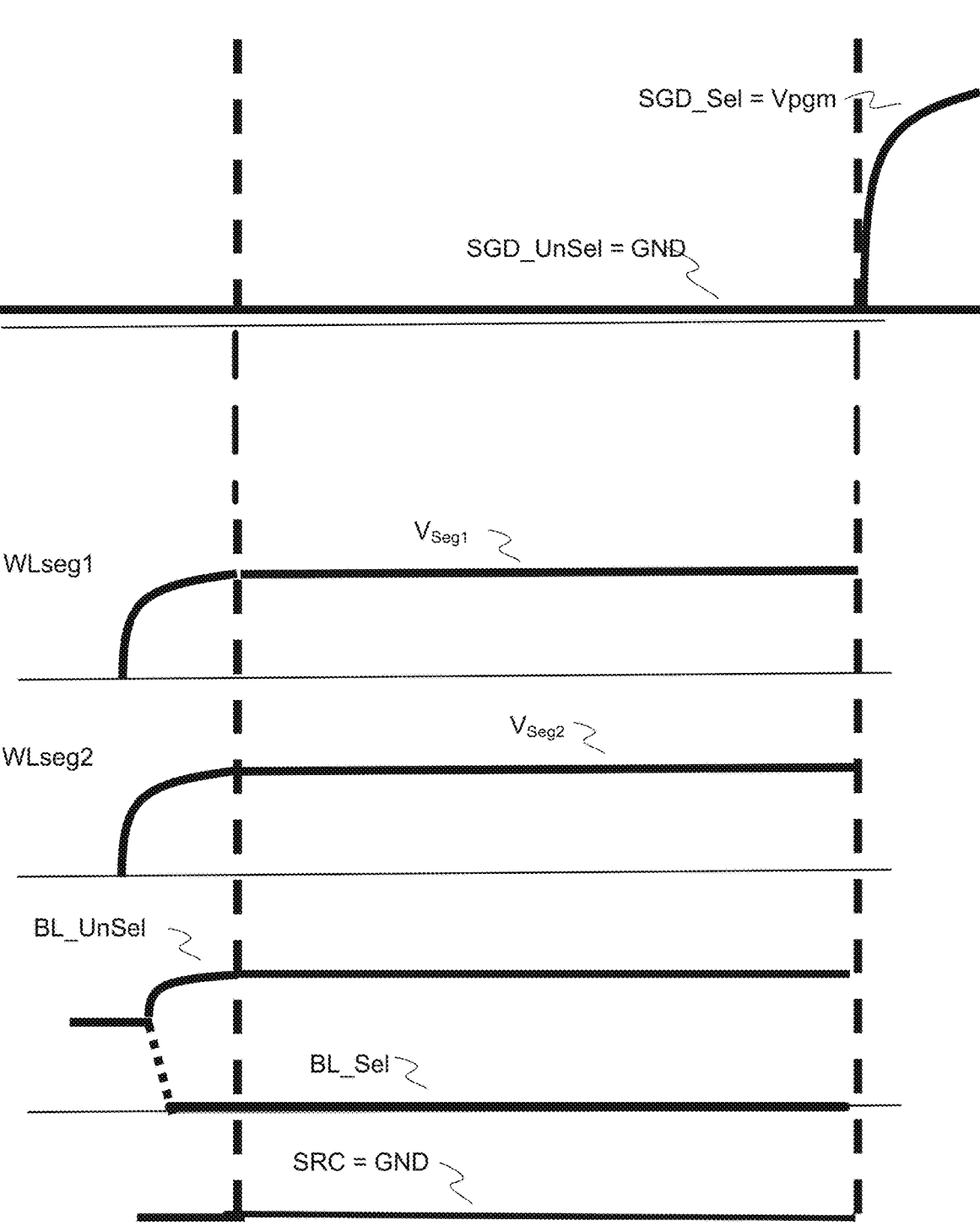
FIG. 5 illustrates example waveforms associated with a seeding scheme including selectively controlling the application of seeding bias levels (i.e., seeding voltages) applied to groups of memory sub-blocks of a memory device, in accordance with one or more embodiments of the present disclosure.

FIG. 5 illustrates example waveforms associated with implementing a variable seeding scheme associated with multiple groups of sub-blocks (e.g., Group 1 and Group 2 of FIG. 4A) during programming of a target memory cell corresponding to a target wordline segment and sub-block (e.g., sub-block 0) of a memory device. In the example shown, the memory device includes four sub-blocks (e.g., sub-block 0, sub-block 1, sub-block 2, and sub-block 3) which are grouped into a first group including sub-block 0 and sub-block 1 and a second group including sub-block 2 and sub-block 3.

According to an embodiment, in block 406 of FIG. 4B (i.e., in response to the initiation of the programming operation of the target memory sub-block of Group 1 (e.g., sub-block 0 or sub-block 1), the control logic (e.g., seeding manager 134 of FIGS. 1A, 1B, and 4A) initiates a controlled seeding scheme where seeding is performed for the sub-blocks of the first group (Group 1) and seeding is skipped for the sub-blocks in the second group. As shown, a first wordline segment (WLseg1) and a second wordline segment (WLseg2) are established, where a first wordline bias voltage (Vseg1) can be applied to the first wordline segment (WLseg1) and a second wordline bias volage (Vseg2) can be applied to the second wordline segment (WLseg2) to variably control the execution of a seeding operation on a sub-block group basis during execution of the programming operation.

In the embodiment shown in the example of FIG. 5, a low voltage level such as a ground voltage level (e.g., approximately 0V) is applied to the SRC corresponding to the sub-blocks of the first sub-block group and the second sub-block group. In this embodiment, since the bias voltage applied to the SRC is ground, the potential of the corresponding channels is grounded during a seeding phase of the programming operation of the target sub-block (e.g., sub-block 0 of the first sub-block group).

In an embodiment, the first wordline bias voltage (Vseg1) can be applied to the first wordline segment (WLseg1) and the second wordline bias voltage (Vseg2) can be applied to the second wordline segment (WLseg2) during a seeding phase (e.g., application of a first subset of programming pulses (e.g., programming pulse X+1 to programming pulse Y)) of the programming operation associated with programming the target sub-block of Group 1). In an embodiment, the control logic causes the seeding to be performed for the first group of sub-blocks (e.g., sub-block 0 and sub-block 1) by applying a first wordline bias voltage (Vseg1) to the first wordline segment (Wseg1) that satisfies the second condition, as described in detail above. In an embodiment, the first wordline bias voltage (Vseg1) satisfies the second seeding operation condition such that the memory cells in sub-block 0 and sub-block 1 are turned "on" and seeding is performed, in accordance with the following expressions:

SB0 is turned "on": $Vseg1 > Vtw_{Lseg1/SB0}$ AND $Vseg2 > Vt_{WLseg2/SB0}$

SB1 is turned "on": $Vseg1 > Vt_{WLseg1/SB1}$ AND $Vseg2 > Vt_{WLseg2/SB1}$

In an embodiment, the control logic selects the second group of sub-blocks to have the seeding skipped during the programming pulse of the programming operation (e.g., programming pulse X+1 to programming pulse Y). In the embodiment shown in FIG. 5, while the ground voltage level is applied to the SRC, the control logic causes the first wordline bias voltage (Vseg1) and the second wordline bias voltage (Vseg2) to the second wordline segment (Wseg2) to be applied that satisfies the first seeding operation condition. In an embodiment, the first seeding operation condition is satisfied the second group (sub-block 2 and sub-block 3) by applying the first wordline bias voltage (Vseg1) to the first wordline segment (WLseg1) and the second wordline bias voltage (Vseg2) to the second wordline segment (WLseg2) to turn "off" the memory cells of the second group of sub-blocks, in accordance with the following expressions:

SB2 is turned "off": EITHER $Vseg1 < Vt_{WLseg1/SB2}$ OR $Vseg2 < Vt_{WLseg2/SB2}$; and SB3 is turned "off": EITHER $Vseg1 < Vt_{WLseg1/SB3}$ OR $Vseg2 < Vt_{WLseg2/SB3}$.

With reference to FIG. 4B, if the processing logic determines that the programming loop number is greater than Y at block 405, the process continues to block 407. At block 407, the processing logic causes seeding of group 1 and the skipping of seeding of group 2 determine if second seeding criteria is satisfied. At block 405, the processing logic determines whether the programming loop is greater than Y (e.g., Y equal programming loop number 10). If the processing logic determines that the current programming loop number is less than Y (i.e., the second seeding criteria), the processing logic performs seeding of group 1 (and the skipping of seeding of group 2) in accordance with the embodiment shown in FIG. 6.

Figure 6:
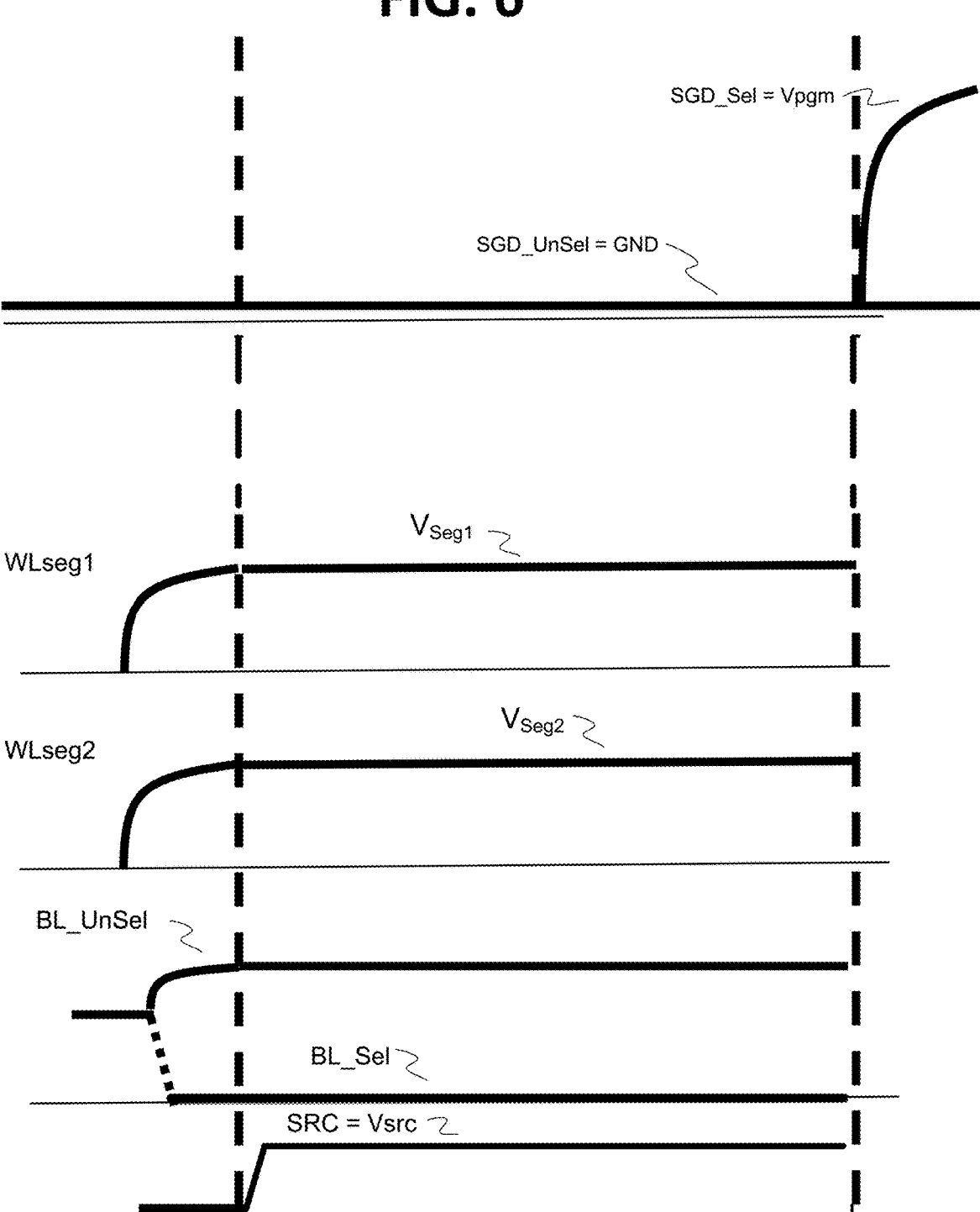
FIG. 6 illustrates example waveforms associated with a seeding scheme including selectively controlling the application of seeding bias levels (i.e., seeding voltages) applied to groups of memory sub-blocks of a memory device, in accordance with one or more embodiments of the present disclosure.

FIG. 6 illustrates example waveforms associated with implementing a variable seeding scheme associated with multiple groups of sub-blocks during programming of a target memory cell corresponding to a target wordline segment and sub-block (e.g., sub-block 0) of the first group of sub-blocks of a memory device. In the example shown in FIG. 6, the memory device includes four sub-blocks (e.g., sub-block 0, sub-block 1, sub-block 2, and sub-block 3) which are grouped into a first group including sub-block 0 and sub-block 1 and a second group including sub-block 2 and sub-block 3. In this example, the target memory cell that is being programmed is included in the first group (e.g., sub-block 0).

In the embodiment illustrated in FIG. 6, a bias voltage is applied to the SRC (Vsrc) during application of the subset of programming pulses of the programming operation (e.g., programming pulses greater than Y). Application of the bias voltage to the SRC (e.g., applying a Vsrc of approximately 2.0V) causes the potential of the channels associated with the sub-blocks to be higher (as compared to applying a ground voltage to the SRC) which increases the stability of the channels during programming.

In this embodiment, while Vsrc is applied to the SRC, the control logic can cause the seeding of the second group of sub-blocks to be skipped (i.e., no seeding bias voltage is applied to the corresponding sub-block) by applying a first wordline bias voltage (Vseg1) to the first wordline segment and a second wordline bias voltage (Vseg2) to the second wordline segment that satisfies the first condition during at least a portion of the application of the programming pulses of the programming operation. In this example, to turn either SB2 or SB3 "off" and disable seeding, the control logic applies Vseg1 and Vseg2 that satisfy the first condition (e.g., either $Vseg1 < Vt_{WLseg1/SB2}$ or $Vseg2 < Vt_{WLseg2/SB2}$ or $Vseg1 < Vt_{WLseg1/SB3}$ or $Vseg2 < Vt_{WLseg2/SB3}$).

Furthermore, while Vsrc is applied to the SRC, the control logic can cause the seeding of the first group of sub-blocks to be performed by applying the first wordline bias voltage (Vseg1) to the first wordline segment and the second wordline bias voltage (Vseg2) to the second wordline segment that satisfies the second condition during at least a portion of the application of the programming pulses of the programming operation. In this example, to turn SB0 and SB1 "on" and enable seeding of the first group of sub-blocks, the control logic applies Vseg1 and Vseg2 that satisfy the second condition, in accordance with the following:

$$Vseg1 > Vt_{WLseg1/SB0} \text{ AND } Vseg2 > Vt_{WLseg2/SB0;and}$$

$$Vseg1 > Vt_{WLseg1/SB1} \text{ AND } Vseg2 > Vt_{WLseg2/SB1}.$$

With reference to FIG. 4B, following the execution of the selective seeding in block 406 (e.g., the seeding approach of FIG. 5) or block 407 (e.g., the seeding approach of FIG. 6), the process continues to blocks 408 and 409 for the completion of the current programming loop and corresponding program verify operation.

Figure 7:
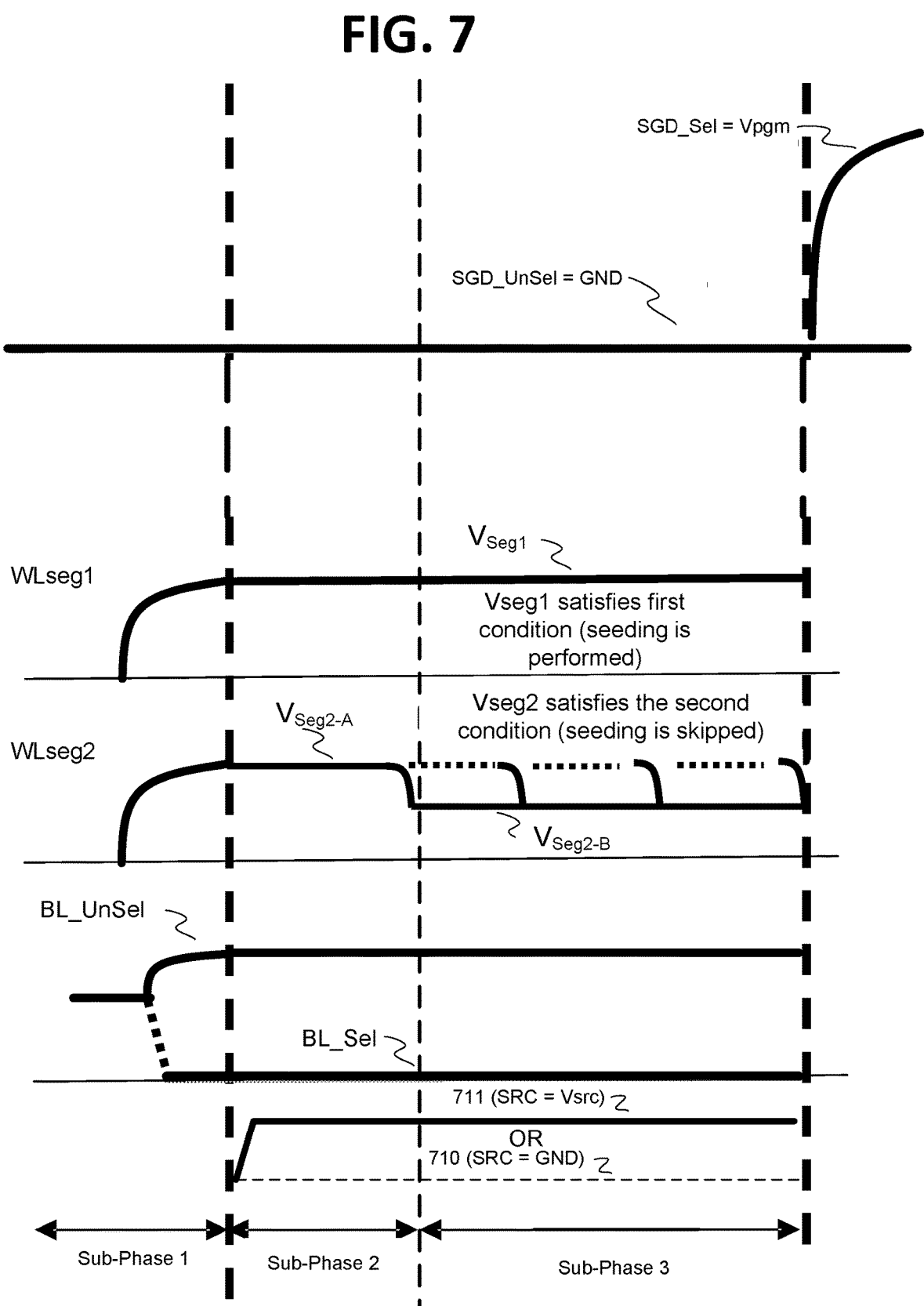
FIG. 7 illustrates example waveforms associated with a seeding scheme including selectively controlling the application of seeding bias levels (i.e., seeding voltages) applied to groups of memory sub-blocks of a memory device, in accordance with one or more embodiments of the present disclosure.

In FIG. 4B, if the processing logic determines that the target sub-block is part of the second group (Group 2) at block 402, the process proceeds to block 410. At block 410, the processing logic determines if the programming loop number satisfies a third seeding criteria (i.e., the programming loop number is less than Z (e.g., Z equals 7)). If it is determined that the programming loop associated with programming a sub-block of group 2 is less than programming loop number Z, the process continues to block 411. In block 411, the processing logic performs seeding of groups 1 and 2 with the SRC set to a ground voltage level, as shown in FIG. 7. If it is determined that the programming loop associated with programming the sub-block of group 2 is greater than or equal to than programming loop number Z, the process continues to block 412. In block 412, the processing logic performs seeding of groups 1 and 2 with the SRC set to Vsrc, as shown in FIG. 7.

FIG. 7 illustrates example waveforms associated with implementing a variable seeding scheme associated with multiple groups of sub-blocks during programming of a target memory cell corresponding to a target wordline segment and sub-block (e.g., sub-block 0) of a memory device. In the example shown in FIG. 7, the memory device includes four sub-blocks (e.g., sub-block 0, sub-block 1, sub-block 2, and sub-block 3) which are grouped into a first group including sub-block 0 and sub-block 1 and a second group including sub-block 2 and sub-block 3. In this example, the one or more target memory cells that are being programmed is included in group 2 (e.g., sub-block 2 or sub-block 3).

In the embodiment illustrated in FIG. 7, the SRC can be supplied with one of either a ground voltage (e.g., as described above with reference to FIG. 5 and as shown in block 411 of FIG. 4B) or a bias voltage (Vsrc) (as described above with reference to FIG. 6 and as shown in block 412 of FIG. 4B), as denoted by dashed lines 710 and 711 in FIG. 7.

In the embodiment shown in FIG. 7, the seeding operation is performed with respect the first group of sub-blocks (e.g., sub-block 0 and sub-block 1) and the second group of sub-blocks (e.g., sub-block 2 and sub-block 3). Accordingly, in this embodiment, the non-selected sub-blocks (e.g., sub-block 0, sub-block 1, and sub-block 3) are seeded during execution of at least a portion of the programming operation associated with one or more target memory cells associated with the target sub-block 0.

As illustrated in FIG. 7, the control logic causes seeding of the target sub-block (e.g., sub-block 0) to be disabled by applying the first wordline bias voltage (Vseg1) to the first wordline segment (WLseg1) and the second wordline bias voltage (Vseg2 including a first level (Vseg2A) and a second level (Vseg2B)) that that satisfies the first condition with respect to the target sub-block (e.g., either Vseg1<Vt$_{WLseg1/SB0}$ or Vseg2A/2B<Vt$_{WLseg2/SB0}$).

As shown in FIG. 7, during a first sub-phase of the programming operation, the second wordline bias voltage (Vseg2) is ramped up to the first level (Vseg2A) and maintained at that level during a second sub-phase of the programming operation. In this embodiment, the second wordline bias voltage is adjusted from the first level (Vseg2A) to the second level (Vseg2B) at a point during a third sub-phase of the programming operation.

FIG. 8 is a flow diagram is a flow diagram of an example method of implementing a seeding scheme including controlling the seeding bias level (i.e., a seeding voltage) applied to segmented wordline associated with multiple groups of memory sub-blocks of a memory device during a program operation in a memory sub-system, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by seeding manager 134 of FIGS. 1A, 1B, and 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a program operation is initiated. For example, the processing logic (e.g., the seeding manager 134 of FIGS. 1A, 1B, and 4) can initiate a program operation to program one or more memory cells of a first sub-block of a memory array of a memory device, the program operation including a seeding phase, where the memory device includes a first sub-block group including the first sub-block and a second sub-block and a second sub-block group including a third sub-block and a fourth sub-block. According to embodiments, the program operation includes the seeding phase, a program phase, and a program verify phase. In certain embodiments, each of these phases can be repeated numerous times in a cycle during a single programming operation.

At operation 820, a first voltage is applied. For example, the processing logic can cause, during the seeding phase, a first wordline voltage to be applied to a first wordline segment associated with the memory array. At operation 830, a second voltage is applied. For example, the processing logic can cause, during the seeding phase, a second wordline voltage to be applied to a second wordline segment associated with the memory array, where no seeding bias voltage is applied to the first sub-block group and where a seeding bias voltage is applied to the second sub-block group. In an embodiment, the first wordline voltage (Vseg1) and the second wordline voltage (Vseg2) satisfy a first condition associated with the first sub-block group (e.g., sub-block 0 and sub-block 1). In an embodiment, in view of the satisfaction of the first condition associated with the first sub-block group, seeding is inhibited for the first sub-block group. In an embodiment, the first condition is satisfied for the first sub-block group to cause both the first sub-block (SB0) and the second sub-block (SB1) to turn "off", such that and no seeding voltage is applied to the first sub-block (SB0) and the second sub-block (SB1), according to the following expressions:

SB0 OFF (Seeding not performed): either Vseg1<Vtw$_{Lseg1/SB0}$ or Vseg2<Vtw$_{WLseg2/SB0}$; and SB1 OFF (Seeding not performed): either Vseg1<Vtw$_{WLseg1/SB2}$ or Vseg2<Vt$_{WLseg2/SB1}$.

In an embodiment, the first wordline voltage (Vseg1) and the second wordline voltage (Vseg2) satisfy a second condition associated with the second sub-block group (e.g., sub-block 2 and sub-block 3). In an embodiment, in view of the satisfaction of the second condition associated with the second sub-block group, a seeding voltage is applied to the second sub-block group. In an embodiment, the second condition is satisfied for the second sub-block group to cause both the third sub-block (SB2) and the fourth sub-block (SB3) to turn "on", such that a seeding bias voltage to be applied to the third sub-block (SB2) and the further sub-block (SB3), according to the following expressions:

SB2 ON (Seeding performed): Vseg1>Vt$_{WLseg1/SB2}$ AND Vseg2>Vt$_{WLseg2/SB2}$; and SB3 ON (Seeding performed): Vseg1>Vt$_{WLseg1/SB3}$ AND Vseg2>Vt$_{WLseg2/SB3}$.

Figure 9:
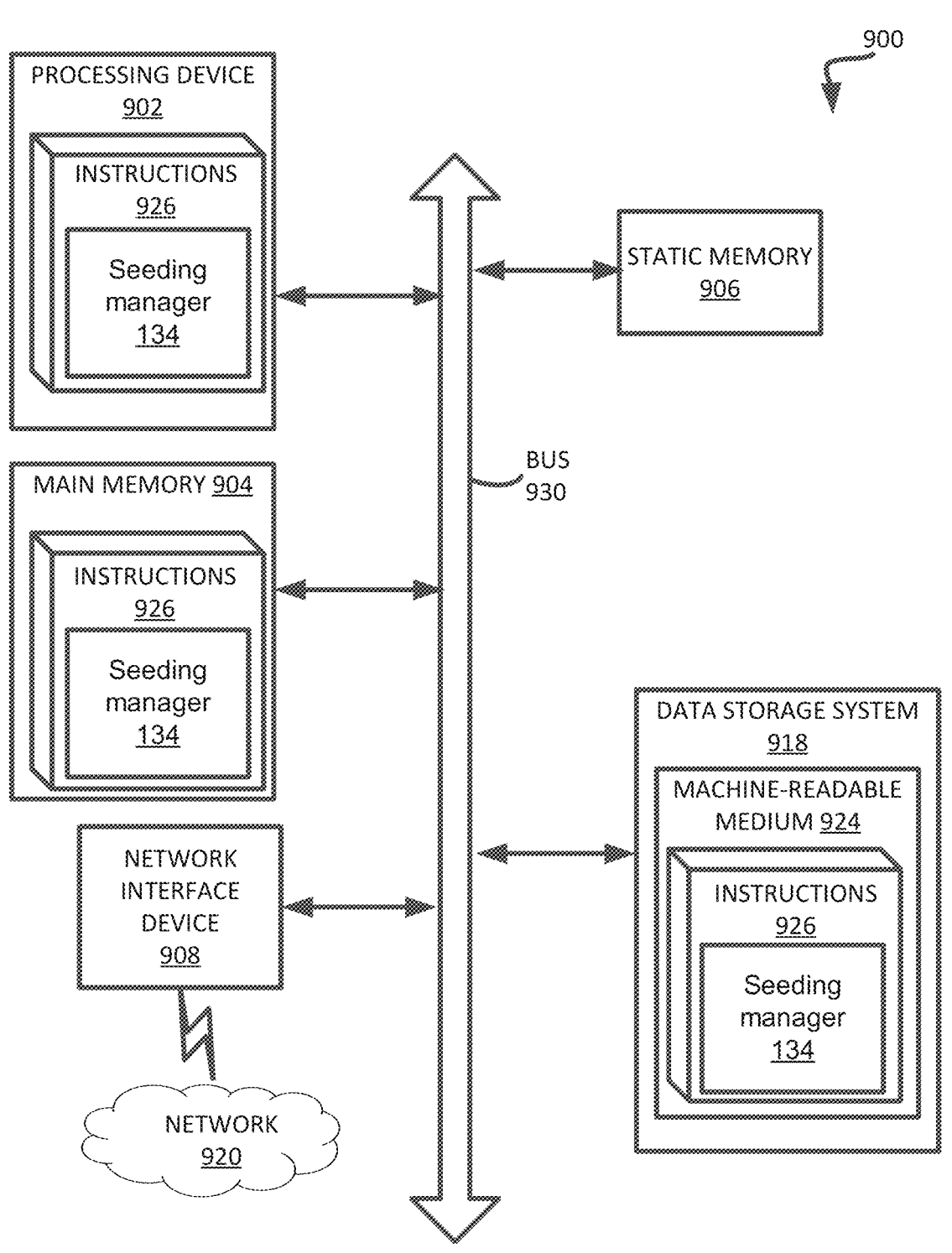
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the seeding manager 134 of FIG. 1A, FIG. 1B, and FIG. 4). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a program manager (e.g., the seeding manager 134 of FIG. 1A and FIG. 1B). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's page buffers and memories into other data similarly represented as physical quantities within the computer system memories or page buffers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising:
    a first sub-block group comprising a first sub-block and
      a second sub-block; and
    a second sub-block group comprising a third sub-block
      and a fourth sub-block; and
control logic, operatively coupled with the memory array,
    to perform operations comprising:
    initiating a program operation to program one or more
      memory cells of the first sub-block of the memory
      array, the program operation comprising a seeding
      phase;
    causing, during the seeding phase, a first wordline
      voltage to be applied to a first wordline segment
      associated with a first portion of the memory array;
      and

US 12,676,191 B2

25

26 causing, during the seeding phase, a second wordline voltage to be applied to a second wordline segment associated with a second portion of the memory array, wherein the first wordline voltage and the second wordline voltage cause a seeding bias voltage to be applied to the first sub-block group and inhibit application of the seeding bias voltage to the second sub-block group.

2. The memory device of claim 1, wherein one or more of the first wordline voltage or the second wordline voltage satisfies a first condition associated with the second sub-block group.

3. The memory device of claim 2, wherein the first condition is satisfied when one or more of the first wordline voltage is less than a first threshold voltage associated with a first memory cell of the third sub-block or the second wordline voltage is less than a second threshold voltage associated with a second memory cell of the fourth sub-block.

4. The memory device of claim 3, wherein the first wordline voltage and the second wordline voltage satisfy a second condition associated with the first sub-block group.

5. The memory device of claim 4, wherein the second condition is satisfied when the first wordline voltage is greater than a third threshold voltage associated with a third memory cell of the first sub-block and the second wordline voltage is greater than a fourth threshold voltage associated with a fourth memory cell of the second sub-block.

6. The memory device of claim 1, wherein a first source bias voltage level is applied during a first subset of programming loops of the programming operation, and wherein a second source bias voltage level that is greater than the first source bias voltage level is applied during a second subset of programming loops of the programming operation.

7. The memory device of claim 1, wherein a first source bias voltage level is applied in response to a voltage programming level exceeding a first voltage level, and wherein a second source bias voltage level that is greater than the first source bias voltage level is applied in response to the voltage programming level exceeding a second voltage level.

8. A method comprising:
initiating a program operation to program one or more memory cells of a first sub-block of a memory device comprising a first sub-block group comprising a first sub-block and a second sub-block and a second sub-block group comprising a third sub-block and a fourth sub-block;
causing, during a seeding phase of the program operation, a first wordline voltage to be applied to a first wordline segment associated with a first portion of a memory array; and
causing, during the seeding phase, a second wordline voltage to be applied to a second wordline segment associated with a second portion of the memory array, wherein the first wordline voltage and the second wordline voltage cause a seeding bias voltage to be applied to the first sub-block group and inhibit application of the seeding bias voltage to the second sub-block group.

9. The method of claim 8, wherein one or more of the first wordline voltage or the second wordline voltage satisfies a first condition associated with the second sub-block group.

10. The method of claim 9, wherein the first condition is satisfied when one or more of the first wordline voltage is less than a first threshold voltage associated with a first memory cell of the third sub-block or the second wordline voltage is less than a second threshold voltage associated with a second memory cell of the fourth sub-block.

11. The method of claim 10, wherein the first wordline voltage and the second wordline voltage satisfy a second condition associated with the first sub-block group.

12. The method of claim 11, wherein the second condition is satisfied when the first wordline voltage is greater than a third threshold voltage associated with a third memory cell of the first sub-block and the second wordline voltage is greater than a fourth threshold voltage associated with a fourth memory cell of the second sub-block.

13. The method of claim 8, wherein a first source bias voltage level is applied during a first subset of programming loops of the programming operation, and wherein a second source bias voltage level that is greater than the first source bias voltage level is applied during a second subset of programming loops of the programming operation.

14. The method of claim 8, wherein a first source bias voltage level is applied in response to a voltage programming level exceeding a first voltage level, and wherein a second source bias voltage level that is greater than the first source bias voltage level is applied in response to the voltage programming level exceeding a second voltage level.

15. A non-transitory computer-readable storage medium comprising instructions that, when executed by a processing device, cause the processing device to perform operations comprising:
initiating a program operation to program one or more memory cells of a first sub-block of a memory device comprising a first sub-block group comprising a first sub-block and a second sub-block and a second sub-block group comprising a third sub-block and a fourth sub-block;
causing, during a seeding phase of the program operation, a first wordline voltage to be applied to a first wordline segment associated with a first portion of a memory array; and
causing, during the seeding phase, a second wordline voltage to be applied to a second wordline segment associated with a second portion of the memory array, wherein the first wordline voltage and the second wordline voltage cause a seeding bias voltage to be applied to the first sub-block group and inhibit application of the seeding bias voltage to the second sub-block group.

16. The non-transitory computer-readable storage medium of claim 15, wherein one or more of the first wordline voltage or the second wordline voltage satisfies a first condition associated with the second sub-block group, and wherein the first condition is satisfied when one or more of the first wordline voltage is less than a first threshold voltage associated with a first memory cell of the third sub-block or the second wordline voltage is less than a second threshold voltage associated with a second memory cell of the fourth sub-block.

17. The non-transitory computer-readable storage medium of claim 15, wherein the first wordline voltage and the second wordline voltage satisfy a second condition associated with the first sub-block group.

18. The non-transitory computer-readable storage medium of claim 17, wherein the second condition is satisfied when the first wordline voltage is greater than a third threshold voltage associated with a third memory cell of the first sub-block and the second wordline voltage is greater than a fourth threshold voltage associated with a fourth memory cell of the second sub-block.

19. The non-transitory computer-readable storage medium of claim 15, wherein a first source bias voltage level is applied during a first subset of programming loops of the programming operation, and wherein a second source bias voltage level that is greater than the first source bias voltage level is applied during a second subset of programming loops of the programming operation.

20. The non-transitory computer-readable storage medium of claim 15, wherein a first source bias voltage level is applied in response to a voltage programming level exceeding a first voltage level, and wherein a second source bias voltage level that is greater than the first source bias voltage level is applied in response to the voltage programming level exceeding a second voltage level.

* * * * *